United States Patent [19]

von Gutfeld

[11] 4,072,864
[45] Feb. 7, 1978

[54] MULTILAYERED SLANT-ANGLE THIN FILM ENERGY DETECTOR

[75] Inventor: Robert Jacob von Gutfeld, New York, N.Y.

[73] Assignee: International Business Machines Corporation, Armonk, N.Y.

[21] Appl. No.: 752,695

[22] Filed: Dec. 20, 1976

[51] Int. Cl.² .................................... G01J 1/00
[52] U.S. Cl. .................................... 250/338; 250/340
[58] Field of Search ............... 250/338, 339, 340, 370, 250/336

[56] References Cited

U.S. PATENT DOCUMENTS 3,851,174  11/1974  Tynan et al. ............... 250/338 X Primary Examiner—Davis L. Willis
Attorney, Agent, or Firm—Graham S. Jones, II

[57] ABSTRACT

A detector of thermal energy is composed of an insulating substrate such as glass or sapphire coated with a thin film deposit of a slant-angle deposited metal preferably a transition element such as Ti, V, Cr, Co, Ni, Ta, W, U, Os, Ir, Pt and Mb exhibiting a transverse thermoelectric effect in response to a thermal energy gradient normal to the plane of the deposit. A layer of an electrical insulating material which is thermally conductive is deposited upon the thin film deposit, using materials such as SiO₂, SiO, perylene, etc. Another thin film deposit of a slant-angle film is deposited on top of the insulating material. A stack of alternate slant-angle thermoelectric elements and electrical insulating layers is formed to a depth at which the thermal gradient in the lowest slant-angle deposit is marginally advantageous. An input light, laser or other heat producing beam is applied to the upper layer of the stack. Alternatively, heat can also be applied to the lower surface through a transparent substrate producing interfacial heating. Heat leaks into other film layers producing a substantial thermal gradient and hence, a thermoelectric transverse voltage in each of the metal films. The layers are interconnected electrically.

19 Claims, 6 Drawing Figures

MULTILAYERED SLANT-ANGLE THIN FILM ENERGY DETECTOR

BACKGROUND OF THE INVENTION

1. Field of the Invention

This invention relates to radiant energy, and more particularly to radiant energy responsive electric signalling whether visible or invisible energy is involved.

2. Description of the Prior Art

A published letter entitled "Enhancement of Transverse Thermoelectric Voltages in Thin Metallic Films" by von Gutfeld and Caswell in Applied Physics Letters, Vol. 25, No. 12, Dec. 15, 1974 p. 691–693 shows a scanning electron micrograph shown here as FIG. 1 which shows the result of evaporation of Mo onto a substrate supported at a 70° angle with respect to the horizontal. The columnar needles form a structure which is clearly visible with columnar needles extending on the order of 1000A in depth and on the order of 300A on a side, separated by approximately the same amount. The columnar needles point in the direction of the incident vapor beam. The columnar structure appears to extend down to the substrate.

In a published letter entitled "Temperature Dependence of Transverse Planar Voltages in Laser-irradiated Pt and Pd Films" by von Gutfeld and Tynan, Applied Physics Letters, Vol. 26, No. 12, June 15, 1976 pp. 680–682, a hypothesis is described as to how slant-angle, vapor-deposited thin films of Mo exposed to laser light produce anisotropic transverse planar voltages. In FIG. 2A hereof taken from that letter it is pointed out that the structure of a slant-angle film can be modeled as a large number of very thin columns of metal parallel with one another. The material is assumed to vary in composition for columns and spaces in between based upon the concept that perhaps more $O_2$ atoms would be trapped near the base of the region between columns than in the columns themselves. A schematic of a model incorporating a composition and temperature periodicity in the plane of vapor deposition in Shown in FIGS. 2A and 2B respectively. The arrows in FIG. 2A indicate illumination by laser light.

A periodic composition and temperature variation in the transverse direction is shown. The regions A represent the slanted film columns. Base areas B are the spaces between columns. For this structure, the resulting thermopower contributions will also be periodic if, first, there exists an increase in defects such as trapped $O_2$ in region B compared to region A due to a higher ratio of residual $O_2$ atoms compared to metal atoms during deposition, and/or, second, there is an increase in size effects for the thinner regions B compared to A.

For the periodic temperature fluctuation shown in FIG. 2A (asymmetric about the midpoint of A) each element AB is equivalent to a microthermocouple and the total transverse voltage will be $$V = nL(S_A - S_B)(T_1 - T_0), \qquad (1)$$

where $n$ is the number of columns/length, L is the transverse length illuminated by the laser, and $S_A$ and $S_B$ are the thermopowers of the regions A and B, respectively. Periodic transverse temperature fluctuations have been inferred using an experimental electrostatic analog method. The value $T_1 - T_0$ is measured at the base of A, from the left to the right in FIG. 2A. $T_1$ is larger than $T_0$ as shown since the point is closer to the end of the needle exposed to radiation R. $T_1 - T_0$ is found to be about 5% of the temperature difference between the top and base of the column for columns inclined 60° from the normal. For zero inclination, $T_1 - T_0$ and the resulting V are both zero. Equation (1) predicts values of V consistent with those observed at room temperature and near the phonon drag peaks for $S_A - S_B$ ($\Delta S$) on the order of 1 $\mu V/°K$ for Pt. At room temperature, this difference determined only from size effect measurements on Pt gives rise to a $\Delta S \sim 0.7$ $\mu V/°K$ for Pt films. The experimentally determined room-temperature change in the bulk thermopower of vanadium due to $O_2$ is $\approx 0.3$ $\mu V/(°K$ at. $\%O_2)$. A similar order-of-magnitude change can be expected in Pt in region B. A quantitative estimate for $\Delta S$ at low temperatures is difficult due to a lack of data for very thin films. Generally, defect scattering will decrease the usual phonon drag thermopower. This decrease should occur especially in region B.

The result is that the columns appear to be a series of microscopic thermocouples connected in a very long series array, thereby producing a substantial voltage.

U.S. Pat. No. 3,851,174 of Tynan and von Gutfeld, assigned to International Business Machines Corporation, filed May 4, 1973 and entitled "Light Detector for Nanosecond-DC Pulse Width Range" describes a dielectric substrate coated with a thin film deposit of a high melting point metal such as Mo or W exhibiting an anisotropy. A pair of electrical contacts is electrically connected at two points on the thin film deposit. A laser pulse is applied to the surface of the thin film deposit, resulting in a voltage pulse across the contacts, proportional in magnitude to the incident pulse.

In a published letter entitled "Phonon-induced planar voltages in thin metallic films," by von Gutfeld, Tynan and Budd, Applied Physics Letters, Vol. 2, January 15, 1976, pp. 78–80, it is shown that any energy producing phonons (i.e. quantized elastic waves or lattice vibrations) such as light, heat or any other thermal source will produce a transverse voltage in slant-angle deposited thin films. Previously, semiconductor films produced at slant angles and optically irradiated had been reported to be photoelectric in nature. The subject letter clarified the fact that what is involved in metallic films is a thermal rather than optical effect.

U.S. Pat. No. 3,697,709 of Dreyfus, assigned to International Business Machines Corporation, describes a beam addressable storage and display tube in which each localized storage element has associated therewith an erase element which is energized by a beam of input energy. The output energy of the erase element is coupled into the associated storage element to affect its state. Thus, this reference shows the use of two adjacent layers of material, one of which is struck by an input beam (such as a light beam) and produces energy which is generally heat or light. This heat energy or light energy directly couples into the associated adjacent storage element to change the state of the storage element. However, this reference does not teach or suggest associated elements of the same material, and especially those exhibiting a transverse thermoelectric effect.

Heretofore, it has been attempted to provide enhanced output by increasing the thickness of slant-angle films. However, it has been found that increasing thickness leads to closure of the spaces between the columns of metal, tending to eliminate the thermoelectric effect altogether. Once the film is about 1500A thick, further thickness causes no change in the voltage up to about 5000A while thicknesses greater than 5000A lead to the above-mentioned decrease in voltage due to closure of spaces.

SUMMARY OF THE INVENTION

In accordance with this invention a substrate of a thermally conductive dielectric material, is coated with a first thin film deposit of an electrically and thermally conductive material having an induced anisotropy. A second thin film deposit of electrically insulating, thermally conductive material is applied to the exposed surface of the first deposit. A third thin film deposit of electrically and thermally conductive material having an induced anisotropy overlies the second deposit. The first and third thin film deposits are connected electrically to at least a pair of contacts for developing a transverse electrical signal (voltage) between the contacts. There are means applied to the structure for establishing a temperature gradient in the layers of deposits normal to the planes of the surfaces of the deposits.

Preferably, the electrically conductive material is a metal. Such a metal should be high in melting point and be included in the transition metal group. Appropriate metals include titanium, vanadium, chromium, cobalt, nickel, iron, tantalum, tungsten, uranium, osmium, indium, platinum, and molybdenum.

Further in accordance with this invention, the temperature gradient is supplied by means for locally directly heating a surface, which means for heating can be a laser, an electron beam or any other source of radiation producing phonons.

Further in accordance with this invention, the electrically conductive thin film deposits are composed of slant-angle deposited metallic films providing a transverse thermoelectric voltage when a thermal gradient is applied preferably at a normal angle to the plane of the films.

An object of this invention is to provide a highly efficient thermoelectric detector responsive to thermal energy gradients applied normal to the exposed surface of the detector.

Another object is to provide a more sensitive detector operable in high temperature environments and when exposed to high levels of energy.

Still another object is a more sensitive detector sensitive to electromagnetic energy from 0.33 to 10.6$\mu$ wavelengths.

DESCRIPTION OF THE PREFERRED EMBODIMENTS

Figure 1:
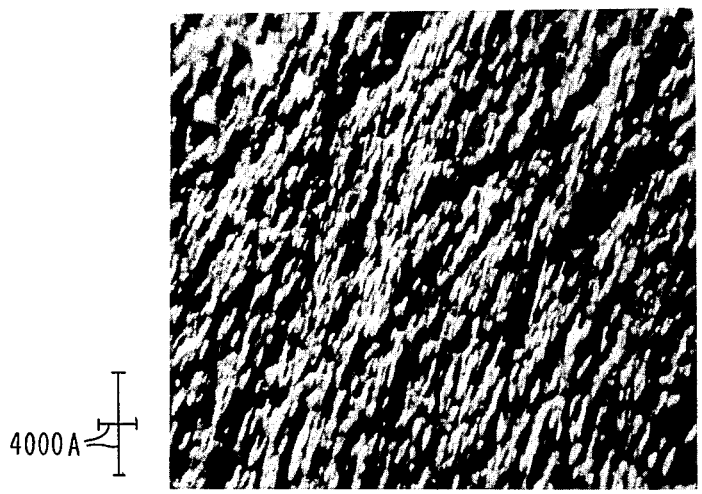
FIG. 1 shows a scanning electron micrograph of a 70° slant-angle thermoelectric, thin film deposit of molybdenum upon a substrate.
Figure 2A:
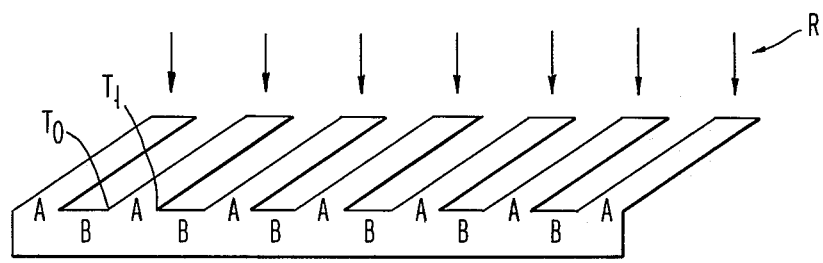
FIG. 2A shows a model of a series of columns of slant-angle deposited metal, with radiation R applied to the metal.
Figure 2B:
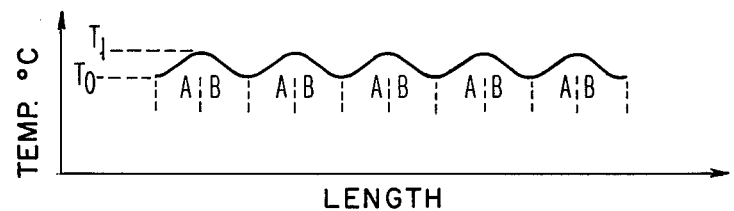
FIG. 2B shows a graph of temperature as a function of length L along the array shown in FIG. 2A illustrating the temperature variations along the bases of the various columns.
Figure 3:
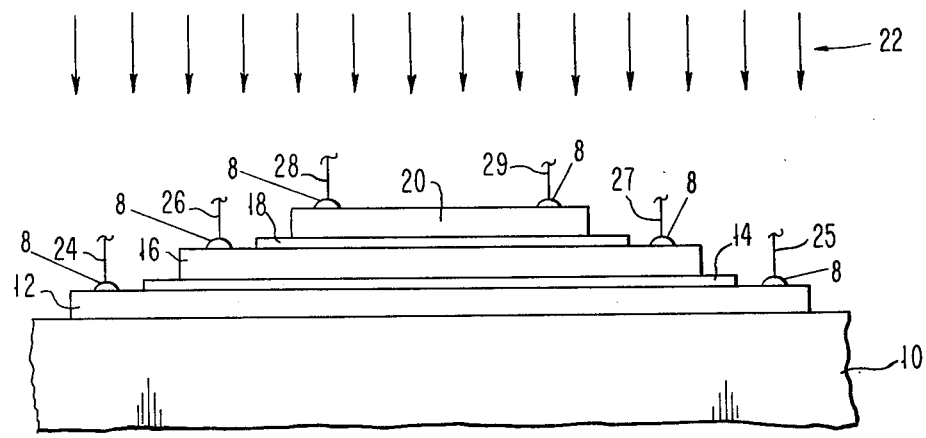
FIG. 3 shows a stack of slant-angle metal films deposited alternately with dielectric layers upon a substrate in accordance with this invention.

FIG. 3 shows radiant energy detector formed on a substrate 10 of a dielectric material (a fragment of which is shown) such as sapphire, quartz, pyrex or other electrical insulating material which is thermally conductive. A thin film deposit 12, about 1500 Angstroms thick, of a slant-angle film is deposited upon substrate 10 by evaporation at a substantial slant angle as is well known in the art. Evaporation is accomplished by means of an induction furnace, electron beam or any other standard system of vacuum evaporation from a single confined source such as a crucible or boat at substantially a single angle of line of sight from source to substrate, so that the slant-angle deposits are relatively uniform across the substrate. Preferably, the substrate is tilted relative to the usual horizontal orientation by a slant angle of, say, 60° – 70°.

A thinner film of an electrical insulating material or dielectric 14 about 300–500 Angstroms thick is deposited at a normal (0°) incident angle (by rotation of substrate 10 in the vacuum chamber until it is horizontal) upon deposit 12 by vacuum evaporation preferably in the same chamber from a separate source by means of masks inserted over deposit 12 by remote control from outside the vacuum chamber. Dielectric 14 is a thermal conductor and can be composed of a material such as perylene, $SiO_2$ or SiO.

Deposit 16 is another slant-angle film vacuum deposited (after rotation of substrate to a slant angle in the vacuum chamber) about 1500 Angstrom thick upon dielectric 14 inset from the ends by another coating mask inserted over dielectric 14.

Dielectric 18, preferably 500 Angstroms thick is vacuum deposited at a normal incident angle (after rotation of substrate 10) through still another smaller mask onto deposit 16.

Finally, the smallest slant-angle deposit 20 is made through a final mask onto dielectric 18 in like manner to deposits 12 and 16.

The structure in FIG. 3 is a multilayered arrangement with several slant angle, thermoelectric films electrically insulated from each other arranged to absorb an optimum amount of energy applied from a radiation source 22 creating a thermal gradient normal to the upper surface of substrate 10, with substrate 10 acting as a heat sink, in this embodiment. However substrate 10 can be used in an opposite way as a heat source. Then heat can be radiated away through the films 12, 14, 16, 18 and 20 from substrate 10 used as a heat source with a similar thermoelectric effect achieved. The important thing is that a thermal gradient would exist to generate a thermoelectric effect.

Source 22 may typically be a laser, an electron beam source, a source of light or infrared radiation but the necessary and sufficient condition as to source 22 is that it must be capable of producing a thermal gradient from the surface to the substrate in the detector of FIG. 3.

The masks described or movable shutters can be employed to achieve the step patterns shown as successive layers are narrower to assure room for contacts and to prevent short circuits in some cases. The normal incident evaporation of dielectric about 500 Angstroms thick provides a reasonably smooth surface for formation of the next deposit of slant-angle columnar needle growth.

Deposit 12 is connected at opposite ends by contacts 8 to leads 24 and 25. Preferably, contacts 8 are formed by acoustic welding of 5 mil flex indium copper wire. Deposit 16 is similarly connected by contacts 8 to wires 26 and 27, and deposit 20 is connected similarly by contacts 8 to wires 28 and 29. In an alternative embodiment, the ends of the deposits may be coated with conductive bands of silver or aluminum, to which electrical leads can be wire bonded in any conventional way. The wires 24, 26, 28, 29, 27, and 25 can be connected in any desired manner to maximize voltage, or current depending upon the relative slant angles involved, as explained in connection with FIGS. 4 and 5.

This detector is known from experiments to be sensitive to radiation in the spectal range of electromagnetic radiation at least from 0.33 to at least 10.6 microns wavelength.

Figure 4:
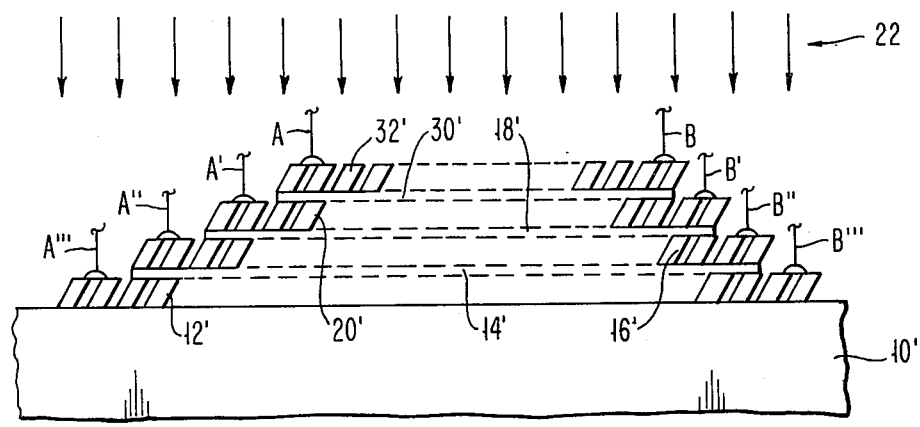
FIG. 4 shows an illustration of a similar structure to that of FIG. 3 with the columns of slant-angle deposited metal exaggerated in size for purposes of illustration with all layers having slant angles aligned in the same direction.

FIG. 4 is an illustration of the thin film structure of a stack of slant angle thermoelectric sensors arranged with all of the slant angles similarly aligned. The slant angle structure is grossly exaggerated in vertical and horizontal dimensions for purposes of illustration. There are four alternate layers of metal detector film deposits 12', 16', 20' and 32' and insulator film 14', 18' and 30'.

For maximum voltage, series connection of leads A, A', A'', A''', B, B', B'', and B''' is required, i.e. A to B', A' to B'', A'' to B'''. In this manner the effective output between points A''' and B is approximately four times that of the voltage between points A and B or that of a conventional detector.

Figure 5:
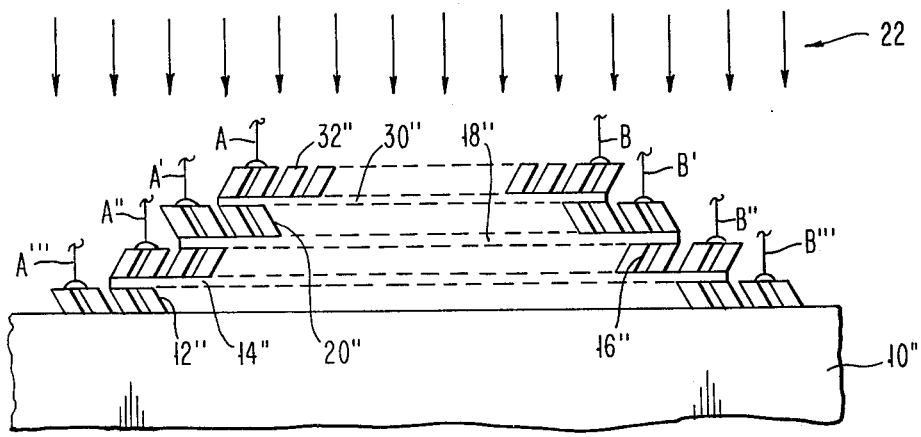
FIG. 5 shows a similar view to FIG. 4 with the slant angles reversed from layer to layer, alternately.

FIG. 5 shows a similar view to FIG. 4 with alternate detector layers 12'' and 20'' slanted left and layers 16'' and 32'' slanted right separated by dielectric film layers 14'', 18'' and 30''.

Now for maximum voltage connections are made from leads A to A', B' to B'' and A'' to A'''. The resulting voltage is measured between points A and B'''.

In the limit of long pulse widths, i.e. of the order of 1 μsec or more, the temperature gradient due to a laser pulse incident normally on the upper surface will be, $$p = k\nabla T$$

where $p$ is the incident power/area, $k$ an average thermal conductivity of the structure and $T$ the temperature. The voltage, $V$, of the multicomponent detector when connected in series will be approximately, $$V \alpha \beta \nabla T = \beta p/k$$

where $\beta$ is the ratio of the net metal film thickness to total thickness over which the gradient extends. Thus, in the limit of uniform gradient, the responsivity of the detector is increased approximately as the number of film layers when connected in series. This result is quite different from that obtained for a simple thick metal film because (1) the columnar nature structure of thick films does not extend through the entire film depths, (2) the voltage of such a film does not increase with increasing thickness, $\tau > \sim 1500$ A. An alternate embodiment which permits easier series interconnection is shown in FIG. 5. Here, alternating directions for the slanted columns are shown for successive films, making all interconnections possible without lead crossovers.

The metal used in the slant-angle films is preferably one of the transition metals, with a high melting point. Suitable metals include titanium, vanadium, chromium, cobalt, nickel, iron, tantalum, tungsten, uranium, osmium, indium, platinum and molybdenum.

The voltage is proportional to the slant angle of the film and the thermal gradient between the top and bottom of the film. Furthermore, the film becomes less adherent when the slant angle is above about 70° from the vertical to the substrate surface. Above 70°, the columns do not follow the evaporation beam direction well. An angle of 60° is convenient and gives good results.

These sensors operate well in very high temperature environments because the materials used are more suitable for such environments than conventional detectors.

EXAMPLE

Experimentally, transverse voltages were measured from the leads of a stack of two molybdenum (Mo) thin films layers separated by a $SiO_2$, thin film layer where the evaporated Mo films were each about 4000 Angstroms thick, and the sputtered $SiO_2$ film was about 6000 Angstroms thick. The structure permitted optical probing with a focused later beam of the lower layer and the upper layer of the stack separately, as well as together. The lower film was rectangular and was somewhat larger in area than the upper film, so portions of the lower film extended well beyond the smaller upper film. Thus the laser beam could be directed to a small portion or spot on the lower film without striking or heating the upper film. Also, with the upper film irradiated, both films could be excited simultaneoulsy to exhibit the thermoelectric voltage. By monitoring the output voltage from each, it was found that for the particular structure used, the upper film was twice as sensitive as the lower. (That was not caused by the $SiO_2$ film because other experiments with coating $SiO_2$ over slant-angle deposits have shown no degradation of the slant-angle film. The derivation is surely within the range of experimental error, and the result could have been the reverse.) When both of the films were connected in series and the sample was irradiated from the top, the voltages added together to produce an enhanced output voltage. This effect occurs in cases of radiation where the pulses are sufficiently long to allow an equilibrium and approximately constant temperature gradient to be established normal to the plane of the surface of the structure. That is, $\nabla T = P/K$ where $P$ is the power/area and $K$ is an average thermal conduction.

At room temperature this will require pulses on the order of at least 100 nsec in order for the gradient to build up in a 15μ thick structure. In the Table below, data is cited for this structure for voltages measured in various ways using about 100mw of incident power at 6471 Angstroms for three separate measurements labeled (1), (2), (3).

TABLE

|  | (1) | (2) | (3) |
|---|---|---|---|
| Light on bottom film alone | 2.5μV±0.2 | 2.5μV±0.2 | 2.5μV±0.2 |
| Light on top measuring bottom | 2.5μV±0.2 | 2.0μV±0.2 | 2.0μV±0.2 |
| Light on top film measuring top film | 4.6μV±0.2 | 4.8μV±0.2 | 4.8μV±0.2 |
| Two films connected in series | 6.8μV±0.4 | 6.8μV±0.2 | 6.8μV±0.2 |

What is claimed is:

1. A detector of electromagnetic waves comprising:

a substrate, of at least average thermal conductivity dielectric material a first thin film deposit of electrically and thermally conductive material having an induced anisotropy, a second thin film deposit of an electrically insulating, thermally conductive material, a third thin film deposit of electrically and thermally conductive material having an induced anisotropy, each of said first and third thin film deposits being connected electrically to at least a pair of contacts for developing an electrical signal between said contacts, and means for establishing a temperature gradient in said deposits in a direction normal to the planes of the surfaces of said deposits.

2. A detector in accordance with claim 1 wherein said electrically conductive material is a metallic material.

3. A detector in accordance with claim 2 wherein said metallic material is a transition metal.

4. A detector in accordance with claim 2 wherein said metallic material is one selected from the group consisting of titanium, vanadium, chromium, cobalt, nickel, iron, tantalum, tungsten, uranium, osmium, indium, platinum and molybdenum.

5. A detector in accordance with claim 1 wherein said means for establishing a temperature gradient includes means for locally heating the outermost one of said thin films.

6. A detector according to claim 5 wherein said means for locally heating is a laser.

7. A detector according to claim 5 wherein said means for locally heating is an electron beam source.

8. A detector in accordance with claim 1 wherein said means for establishing a temperature gradient includes means for applying heat from said substrate towards said films, said substrate being an electrical insulator disposed in supporting relationship with respect to said first film.

9. A detector in accordance with claim 8 wherein each of said first and third thin film deposits comprises a film deposited by evaporation at a slant angle providing a thermoelectric voltage in response to a temperature gradient through the thickness of said first and third thin film deposits.

10. A detector in accordance with claim 9 wherein said temperature gradient is applied normal to the planes of said deposits and said thermoelectric voltage is transverse of the plane of said thin film deposits along the direction of said slant-angle deposits.

11. A detector in accordance with claim 9 wherein said first and third thin films are arranged to produce a thermal gradient normal to the plane of said first and second thin films.

12. A detector according to claim 8 wherein said means for locally heating is a laser.

13. A detector according to claim 8 wherein said means for locally heating is an electron beam source.

14. A detector in accordance with claim 1, wherein each of said first and third thin films exhibits a thermoelectric effect.

15. A method for detecting electromagnetic waves comprising the steps of:

producing anisotropy in a sandwich of thin films of conductive material, said thin films being insulated from one another, establishing a temperature gradient in said film in a direction normal to the plane of said films and, detecting a thermoelectric voltage at at least a pair of contacts connected to said films.

16. A method according to claim 15 wherein the step of producing anisotropy in a sandwich of thin films includes the step of:

forming said thin films by slant-angle deposition of said thin films to produce a transverse thermoelectric potential across said films.

17. A method according to claim 15 wherein the step of establishing a temperature gradient includes the step of:

heating a portion of said thin film with pulsed energy.

18. A method for detecting electromagnetic waves comprising the steps of:

producing anisotropy in a sandwich of thin films of conductive material formed on a substrate of electrically insulating material, said thin films being insulated from one another, establishing a temperature gradient in said films and said substrate with a component in a direction normal to the plane of said films, and detecting a thermoelectric voltage at at least a pair of contacts connected to said films.

19. A method according to claim 18 wherein the step of establishing a temperature gradient includes the step of:

heating a portion of said film and said substrate with focused energy.

* * * * *